United States Patent
Takehara

(10) Patent No.: US 9,588,159 B2
(45) Date of Patent: *Mar. 7, 2017

(54) ENERGY MANAGEMENT APPARATUS, SYSTEM, METHOD, AND STORAGE MEDIUM STORING PROGRAM

(71) Applicant: Panasonic Corporation, Kadoma-shi, Osaka (JP)

(72) Inventor: Kiyotaka Takehara, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 222 days.

This patent is subject to a terminal disclaimer.

(21) Appl. No.: 14/497,505

(22) Filed: Sep. 26, 2014

(65) Prior Publication Data

US 2015/0008900 A1   Jan. 8, 2015

Related U.S. Application Data

(63) Continuation of application No. PCT/JP2013/000634, filed on Feb. 6, 2013.

(30) Foreign Application Priority Data

Mar. 30, 2012 (JP) ................. 2012-080773

(51) Int. Cl.
*G01R 21/00* (2006.01)
*H02J 3/00* (2006.01)
(Continued)

(52) U.S. Cl.
CPC ............. *G01R 21/00* (2013.01); *G01R 17/02* (2013.01); *G05F 1/66* (2013.01); *G06Q 10/06* (2013.01); *H02J 3/00* (2013.01); *H02J 13/001* (2013.01)

(58) Field of Classification Search
CPC combination set(s) only.
See application file for complete search history.

(56) References Cited

U.S. PATENT DOCUMENTS

2009/0191526 A1\* 7/2009 Kumazawa ............ G09B 19/00
                                                        434/236
2011/0211851 A1    9/2011 Imine et al.
2012/0316693 A1   12/2012 Ogawa et al.

FOREIGN PATENT DOCUMENTS

JP    H09-53954 A     2/1997
JP    2002-051463 A   2/2002
(Continued)

OTHER PUBLICATIONS

European search report issued on Oct. 12, 2015 in the counterpart European patent application.

(Continued)

*Primary Examiner* — Clayton E Laballe
*Assistant Examiner* — Jas Sanghera
(74) *Attorney, Agent, or Firm* — Mots Law, PLLC

(57) ABSTRACT

An acquisition unit acquires first measurement values of the amounts of electric power of respective branch circuits or respective load devices and second measurement values of the amount of electric power of a master circuit provided for a building from a measurement device. An overall set unit obtains an overall reference value on the basis of a history of the second measurement values, and the unit receives a reduction target to set an overall target value on the basis of the overall reference value and the reduction target. An individual set unit sets an individual target value by distributing the overall target value set in the overall set unit to the amounts of electric power of the respective branch circuits or the respective load devices as allocation objects. A display instruction unit instructs display of the individual target (Continued)

value and the first measurement values acquired by the acquisition unit.

20 Claims, 11 Drawing Sheets

(51) Int. Cl.
    *H02J 13/00*     (2006.01)
    *G01R 17/02*     (2006.01)
    *G05F 1/66*     (2006.01)
    *G06Q 10/06*     (2012.01)

(56) References Cited

FOREIGN PATENT DOCUMENTS

| | | |
|---|---|---|
| JP | 2002-202998 A | 7/2002 |
| JP | 2003-088004 A | 3/2003 |
| JP | 2005-234746 A | 9/2005 |
| JP | 2011-142753 A | 7/2011 |
| WO | 2011/030200 A1 | 3/2011 |

OTHER PUBLICATIONS

International Search Report for PCT/JP2013/000634 issued on Apr. 9, 2013.

\* cited by examiner

| | TERM | | TIME BAND | | REDUC-TION RATE (%) |
|---|---|---|---|---|---|
| | START DATE | COMPLETION DATE | START DATE | COMPLETION DATE | |
| LONG TERM | 1ST JULY | 30TH SEPTEMBER | 9 : 00 | 21 : 00 | 10 |
| MEDIUM TERM | 1ST AUGUST | 7TH AUGUST | 9 : 00 | 21 : 00 | 15 |
| SHORT TERM | 3RD AUGUST | 3RD AUGUST | 13 : 00 | 16 : 00 | 20 |
| | | | | | |

| MASTER | BRANCH D1 | BRANCH D2 | ....... | BRANCH Dn |
|---|---|---|---|---|
| 0.3 | 0.1 | 0.1 | | 0.01 |

| TIMESTAMP | MASTER | BRANCH D1 | BRANCH D2 | ....... | BRANCH Dn |
|---|---|---|---|---|---|
| 2011.01.01.00 | 3.0 | 0.5 | 0.3 | | 0.1 |
| 2011.01.01.01 | 3.1 | 0.5 | 0.3 | | 0.1 |
| ⋮ | | | | | |
| 2011.01.01.23 | 4.0 | 0.8 | 0.5 | | 0.1 |
| ⋮ | | | | | |

1124

| DEVICE/BRANCH CIRCUIT | INDIVIDUAL REFERENCE VALUE BEFORE CORRECTION (kWh) | INDIVIDUAL REFERENCE VALUE AFTER CORRECTION (kWh) | TARGET VALUE (kWh) |
|---|---|---|---|
| LOAD DEVICE 41 | 2.0 | 1.8 | 1.62 |
| ⋮ | ⋮ | ⋮ | |
| LOAD DEVICE 46 | 1.0 | 0.9 | 0.81 |
| BRANCH D7 | 0.5 | 0.45 | 0.405 |
| ⋮ | ⋮ | ⋮ | |
| BRANCH Dn | 0.1 | 0.09 | 0.081 |

FIG.10

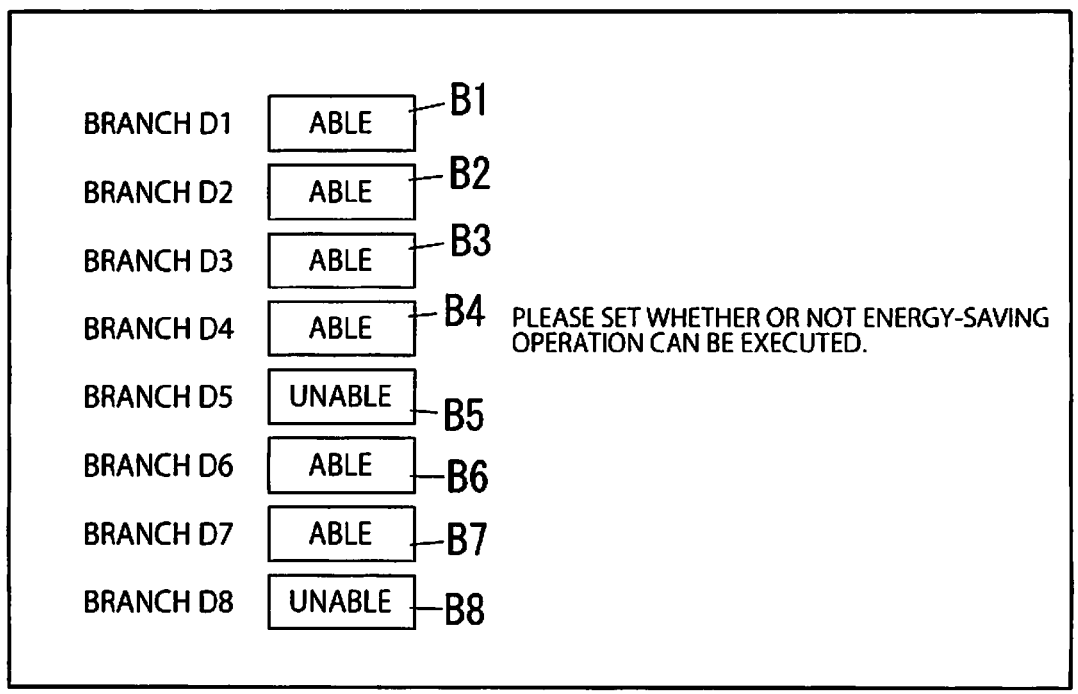

BRANCH D1　ABLE　―B1
BRANCH D2　ABLE　―B2
BRANCH D3　ABLE　―B3
BRANCH D4　ABLE　―B4　PLEASE SET WHETHER OR NOT ENERGY-SAVING OPERATION CAN BE EXECUTED.
BRANCH D5　UNABLE　―B5
BRANCH D6　ABLE　―B6
BRANCH D7　ABLE　―B7
BRANCH D8　UNABLE　―B8

| DEVICE/BRANCH CIRCUIT | EXECUTION OF ENERGY-SAVING OPERATION |
|---|---|
| BRANCH D1 | POSSIBLE |
| BRANCH D2 | POSSIBLE |
| BRANCH D3 | POSSIBLE |
| BRANCH D4 | POSSIBLE |
| BRANCH D5 | IMPOSSIBLE |
| BRANCH D6 | POSSIBLE |
| BRANCH D7 | POSSIBLE |
| BRANCH D8 | IMPOSSIBLE |

FIG.12

| DEVICE/BRANCH CIRCUIT | REFERENCE VALUE BEFORE COLLECTION (kWh) | TARGET VALUE (kWh) 1124 |
|---|---|---|
| BRANCH D1 | 2.0 | 1.53 |
| BRANCH D2 | 1.0 | 0.76 |
| BRANCH D3 | 1.5 | 1.14 |
| BRANCH D4 | 1.5 | 1.14 |
| BRANCH D5 | 1.5 | 1.5 |
| BRANCH D6 | 1.0 | 0.76 |
| BRANCH D7 | 1.0 | 0.76 |
| BRANCH D8 | 0.5 | 0.5 |

FIG.13

| DEVICE GROUP | DEVICE/BRANCH CIRCUIT | ENERGY-SAVING OPERATION | TARGET VALUE (kWh) |
|---|---|---|---|
| AIR-CONDITIONER | BRANCH D1 | OBJECT | 4 |
|  | BRANCH D2 | OBJECT |  |
|  | BRANCH D3 | OBJECT |  |
| ILLUMINATION DEVICE | BRANCH D4 | OBJECT | 2 |
|  | BRANCH D5 | OBJECT |  |
| IH | BRANCH D6 | OBJECT | 1 |
| OTHER DEVICE | BRANCH D7 | NOT OBJECT |  |
| OTHER DEVICE | BRANCH D8 | NOT OBJECT |  |

FIG.14

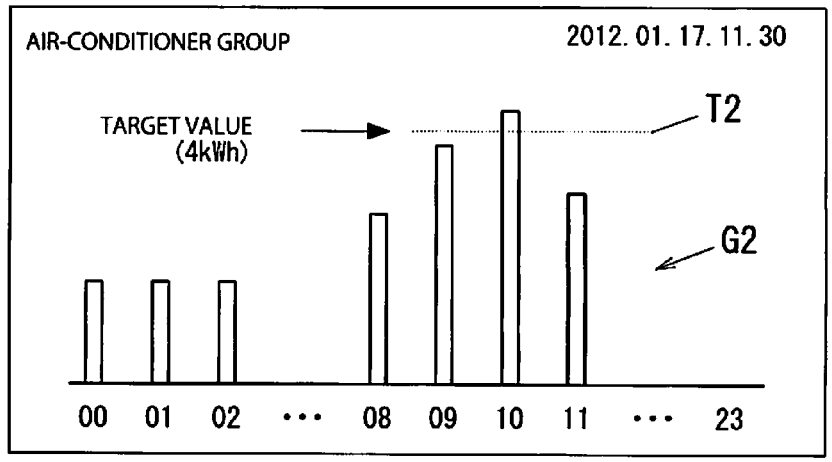

ENERGY MANAGEMENT APPARATUS, SYSTEM, METHOD, AND STORAGE MEDIUM STORING PROGRAM

CROSS REFERENCE TO RELATED APPLICATIONS

This application is a continuation application of PCT International Application No. PCT/JP2013/00634, filed on Feb. 6, 2013, entitled "ENERGY MANAGEMENT APPARATUS, ENERGY MANAGEMENT SYSTEM, AND STORAGE MEDIUM STORING PROGRAM", which claims priority based on Article 8 of Patent Cooperation Treaty from prior Japanese Patent Applications No. 2012-080773, filed on Mar. 30, 2012, the entire contents of which are incorporated herein by reference.

TECHNICAL FIELD

The disclosure relates to an energy management apparatus, an energy management system, an energy management method, and a storage medium storing a program, which visualize electric power in use in order to attain a reduction target set by a consumer of electric power.

BACKGROUND ART

Conventionally, there is proposed a technology in which a target value is set for the amount of electric power to be used by a consumer and the set target value and the amount of electric power used by the consumer are displayed for comparison, thereby causing a consumer to be aware of reducing the amount of electric power to be used.

For example, Japanese Patent Application Publication No. 2005-234746 discloses that a unit term such as one year or one month is divided into a term such as one month or one day, a target value is set for every divided term, and an energy amount to be consumed from this time is predicted from the target value of each divided term. Specifically, a ratio of the actual value to the target value is calculated as a target rate for every divided term, and an energy amount from this term is predicted using transition of the target rates. In addition, an accumulated value of the energy amount in a unit term from the predicted energy amount is obtained, and propriety of attaining the target is predicted on the basis of the accumulated value.

The abovementioned document states that data of the amount of electric power of each energy management target may be collected, and thus suggests not only a case where the energy amount is managed for only one system before being branched from a distribution board but also a case where the energy amount is individually managed for each energy management target.

Meanwhile, the abovementioned document does not suggest a technique of setting a target value, and in particular, in the case the energy amount is individually managed for each energy management target, does not state how to set each target value.

Recently, a reduction target of the amount of electric power may be set due to a request from an electric power company or the like in some cases. Alternatively, a consumer him/herself may set a reduction target of the amount of electric power in some cases. Because such a reduction target is determined on the amount of electric power purchased from the power supply system of the commercial power source, it is difficult for the consumer to set each target value of the amount of electric power to be used in an individual branch circuit or an individual load device, in order to attain the reduction target. In other words, setting a target value of each branch circuit or each load device in order to reduce the amount of electric power gives rise to a large burden to the consumer.

Moreover, managing only a reduction target with respect to the overall amount of electric power of the consumer is likely to cause overages or shortages of the amount of electric power to be used because the amount of electric power which can be used for each branch circuit or each load device within the range of the reduction target is unknown. As a result, there arises a problem that the amount of electric power is reduced by 5% or 20% regardless of a reduction target being set to 10%.

DISCLOSURE OF THE INVENTION

Therefore, one aspect of the invention is to provide an energy management apparatus, an energy management system, and a storage medium storing a program which enable a consumer to be aware of energy management by displaying a relation between transition of measurement values and a target value of each branch circuit or each load device, and further to attain a reduction target without occurrence of large overages or shortages by distributing a reduction target set for the amount of electric power of a master circuit as appropriate to target values of the amounts of electric power of the respective branch circuits or the respective load devices.

To attain the above features, at least one embodiment of the invention provides an energy management apparatus, including: an acquisition unit configured to acquire first measurement values of the amounts of electric power of respective branch circuits or respective load devices and second measurement values of the amount of electric power of a master circuit provided for a building from a measurement device; an overall set unit configured to obtain an overall reference value on the basis of a history of the second measurement values, and to receive a reduction target to set an overall target value on the basis of the overall reference value and the reduction target; an individual set unit configured to set an individual target value by distributing the overall target value set in the overall set unit to the amounts of electric power of the respective branch circuits or the respective load devices as allocation objects; and a display instruction unit configured to instruct display of the individual target value and the first measurement values acquired by the acquisition unit.

In the energy management apparatus, the overall set unit may include a term specification unit configured to specify a target term during which the overall target value is set.

In the energy management apparatus, the individual set unit may obtain an individual reference value by multiplying the amount of electric power of the branch circuit or the load device as the allocation object by a ratio of the amount of electric power of the master circuit to a total sum of the first measurement values, and set the individual target value by evenly distributing the overall target value to the individual reference values.

In the energy management apparatus, the individual set unit may obtain an individual reference value before correction on the basis of the history of the second measurement values, obtain an individual reference value by multiplying the individual reference value before correction for each of the branch circuits or each of the load devices by a ratio of the overall reference value to a total sum of the individual reference values before correction in the branch circuits or the load devices as the allocation objects, and set the individual target value by evenly distributing the overall target value to the individual reference values.

In the energy management apparatus, the apparatus may further include a propriety storage unit configured to store therein propriety information indicating whether or not reduction of the electric power of each of the branch circuits or each of the load devices can be implemented, wherein the individual set unit includes a selection unit configured to cause a user to set the propriety information stored in the propriety storage unit.

In the energy management apparatus, the individual set unit may arrange the amounts of electric power of the branch circuits or the load devices in descending order, and selects one of or multiple of the branch circuits or the load devices in the higher order of the amounts of electric power of the branch circuits or the load devices as the allocation object.

In the energy management apparatus, the apparatus may further include: a type classification unit configured to classify types of changes of electric power using change patterns of the amounts of electric power of the branch circuits or the load devices. And the display instruction unit may be configured to cause the display screen to display advice for reducing the amount of electric power of the branch circuit or the load device using the type classified by the type classification unit.

To attain the above features, at least one embodiment of the invention provides an energy management system, including the measurement device attached to a distribution board installed at or adjacent to a building or a load device used by a consumer and configured to measure the amount of electric power; and the energy management apparatus described above.

To attain the above features, at least one embodiment of the invention provides a non-transitory computer-readable storage medium storing therein a program to cause a computer to function as an energy management apparatus when executing the program, including: an acquisition unit configured to acquire first measurement values of the amounts of electric power of respective branch circuits or respective load devices and second measurement values of the amount of electric power of a master circuit provided for a building from a measurement device; an overall set unit configured to obtain an overall reference value on the basis of a history of the second measurement values; an individual set unit configured to set an individual target value by distributing the overall target value set in the overall set unit to the amounts of electric power of the respective branch circuits or the respective load devices as allocation objects; and a display instruction unit configured to instruct display of the individual target value and the first measurement values acquired by the acquisition unit.

To attain the above features, at least one embodiment of the invention provides an energy management method, including: acquiring, by a computer, first measurement values of the amounts of electric power of respective branch circuits or respective load devices and second measurement values of the amount of electric power of a master circuit provided for a building; obtaining an overall reference value on the basis of a history of the first measurement values, and receiving a reduction target to set an overall target value on the basis of the overall reference value and the reduction target; setting an individual target value by distributing the overall target value set in the overall set unit to the amounts of electric power of the respective branch circuits or the respective load devices as allocation objects; and instructing display of the individual target value and the first measurement values.

With the configuration according to an embodiment of the invention, it is possible to cause a consumer to be aware of energy management by displaying a relation between transition of measurement values and a target value of each branch circuit or each load device. In addition, there is an advantage in that it is possible to attain a reduction target without occurrence of large overages or shortages by distributing a reduction target set for the amount of electric power of a master circuit as appropriate to target values of the amounts of electric power of the respective branch circuits or the respective load devices.

BRIEF DESCRIPTION OF DRAWINGS

Preferred embodiments of the invention are described in further details. Other features and advantages of the invention can be better understood in relation to the following detailed description and the attached drawings.

FIG. 4 is a view illustrating a data example of an overall target storage unit used in the energy management apparatus according to the first embodiment.

FIG. 5 is a view illustrating a data example of a sequential storage unit used in the energy management apparatus according to the first embodiment.

FIG. 6 is a view illustrating a data example of a history storage unit used in the energy management apparatus according to the first embodiment.

FIG. 10 is a view illustrating an example of a screen on which an allocation object is selected in the energy management apparatus according to the second embodiment.

FIG. 11 is a view illustrating a data example of a propriety storage unit used in the energy management apparatus according to the second embodiment.

FIG. 12 is a view illustrating a data example of an individual target storage unit used in the energy management apparatus according to the second embodiment.

FIG. 13 is a view illustrating an example of grouping load devices in the energy management apparatus according to the second embodiment.

FIG. 14 is a view illustrating a display example when the load devices are grouped in the energy management apparatus according to the second embodiment.

DETAILED DESCRIPTION

First Embodiment

An embodiment below describes a case where an energy management apparatus is used in a residential house, as an example. Further, the energy management apparatus in the embodiment can be used in a building such as an office building or a commercial building, other than the residential house. In any case, a consumer who is aware of reducing the amount of electric power to be used can manage a reduction target using the energy management apparatus described below.

Figure 2:
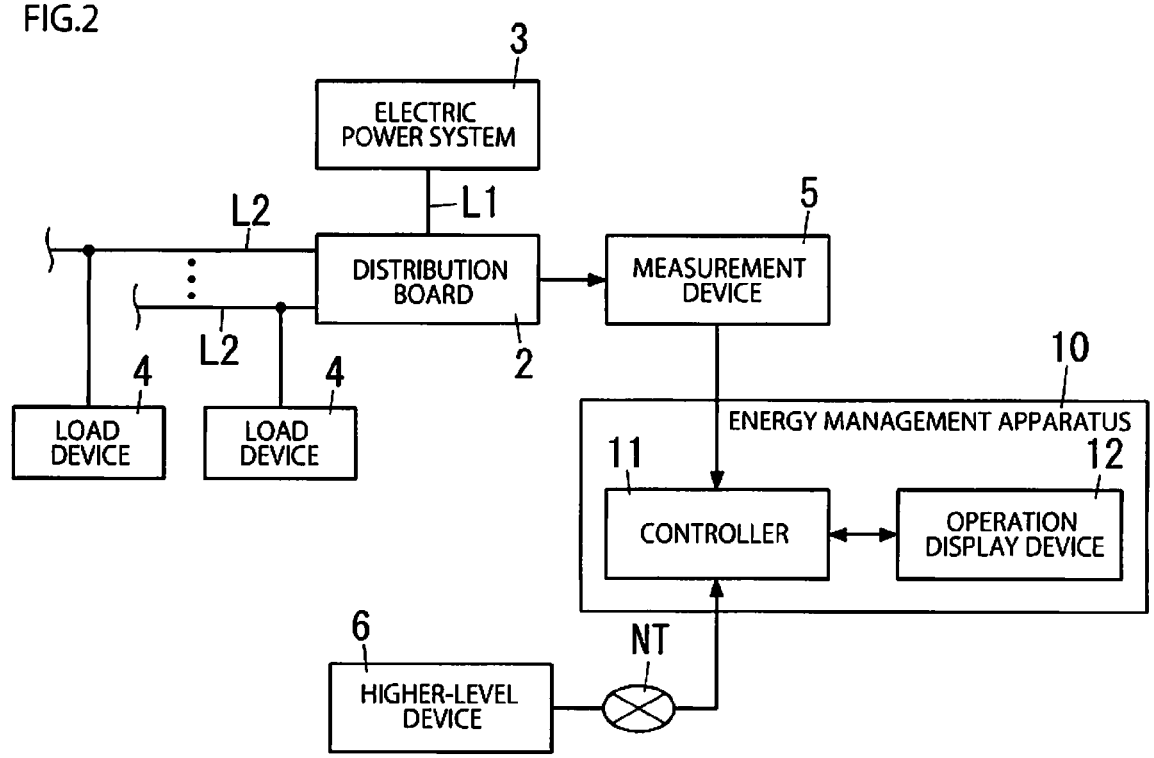
FIG. 2 is a configuration diagram illustrating an example of an energy management system, which uses the energy management apparatus according to the first embodiment.

As illustrated in FIG. 2, distribution board 2 disposed at or adjacent to a consumer's house is connected with power line L1, which supplies electric power from electric power system 3 of a commercial power source and multiple power lines L2, which supply electric power to load devices 4 in the house. Further, although it is on the precondition that distribution board 2 is connected to electric power system 3 of the commercial power source via power line L1, a self-power generation device such as a solar power generation device and a fuel cell, a power storage device, or the like may be connected to distribution board 2.

Figure 3:
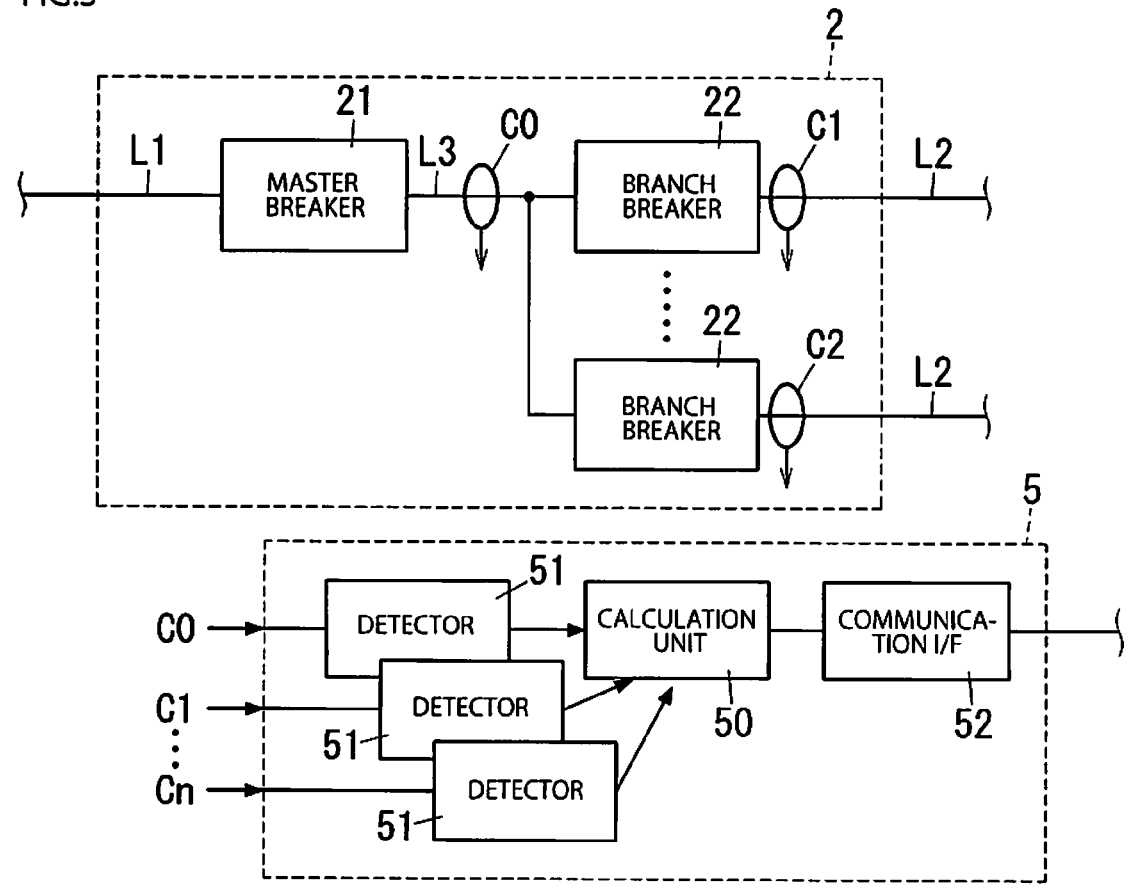
FIG. 3 is a configuration diagram illustrating a principal part of the energy management system illustrated in FIG. 2.

As illustrated in FIG. 3, distribution board 2 includes master breaker 21 connected to power line L1 which supplies electric power from electric power system 3, and multiple branch breakers 22 connected to master breaker 21 at a load side via electric conductor L3. Branch breakers 22 are connected with power lines L2, which connect load devices 4 thereto. Measurement device 5 attached to distribution board 2 measures the amount of electric power passing through power lines L2 and electric conductor L3. Power line L1 and electric conductor L3 correspond to a master circuit, and power lines L2 correspond to a branch circuit.

Measurement device 5 includes detectors 51 that detect outputs from electric power sensors C0, C1 to Cn respectively disposed in electric conductor L3 and power lines L2, and calculation unit 50 which obtains, from the outputs from detectors 51, the amounts of electric power respectively passing through multiple power lines L2 and electric conductor L3. In addition, measurement device 5 further includes communication interface unit 52 for notifying another device of the amount of electric power obtained by calculation unit 50. Hereinafter, "communication interface unit" is abbreviated as "communication I/F".

In the illustrated example, although measurement device 5 is attached to distribution board 2 and measures the amount of electric power using the branch circuit (in other words, power line L2) connected to branch breaker 22 as a unit, measurement device 5 may be attached to load device 4 and measure the amount of electric power of each load device 4. Alternatively, measurement device 5 may be attached to a plug socket (not illustrated) to be connected to power line L2, and measure the amount of electric power using the plug socket as a unit.

Measurement device 5 measures the amount of electric power passing through the master circuit, and the amount of electric power passing through each branch circuit or the amount of electric power consumed by each load device 4. Hereinafter, the amount of electric power passing through the master circuit is referred to as the amount of electric power of the master circuit, the amount of electric power passing through the branch circuit is referred to as the amount of electric power of branch circuit, and the amount of electric power consumed by load device 4 is referred to as the amount of electric power of load device 4. Moreover, load device 4 such as an air-conditioner or an IH (Induction Heating) cooking device is often in one-to-one association with a branch circuit. In this case, because the amount of electric power of branch circuit is consistent with the amount of electric power of load device 4, only the "branch circuit" is described hereinafter as long as there is no particular need to distinguish between the branch circuit and load device 4. In other words, if the amount of electric power of branch circuit and the amount of electric power of load device 4 are not necessary to be distinguished from each other, the amount of electric power of load device 4 is described as the amount of electric power of branch circuit.

In the illustrated example, for each simplified measurement of the amount of electric power, current sensors including current transformers are used as electric power sensors C0, C1 to Cn. Further, electric power sensors C0, C1 to Cn may be configured to measure both the current and the voltage for the improved measurement accuracy. Detector 51 has functions of performing preliminary processing such as offset adjustment, noise rejection, amplification for outputs from electric power sensors C0, C1 to Cn, and an AD conversion, which converts a signal after the preliminary processing into a digital signal. Calculation unit 50 is configured to include a device such as a microcomputer, which operates due to execution of a program as a main hardware element. Communication I/F 52 may be configured to perform wireless communication, and may be configured to perform wired communication. The amount of electric power measured by measurement device 5 is the amount of electric power in a sampling period of time (for example, one minute). Measurement device 5 successively transmits the amount of electric power of every sampling period of time as a measurement value to energy management apparatus 1. Further, the sampling period of time described above is an example, and the sampling period of time is set as appropriate.

Energy management apparatus 1 includes controller 11 that performs communication with measurement device 5, and operation display device 12 including a display module which displays information obtained by controller 11 and an operation module which gives an instruction to controller 11. In operation display device 12, a flat panel display such as a liquid crystal display may be used for the display module, and a mechanical switch such as a push button switch may be used for the operation module. The display module and the operation module in operation display device 12 may be configured as a touch panel, or a combination of a touch panel and a mechanical switch. Moreover, operation display device 12 further includes a circuit unit for operating the display module and the operation module, and the display module and the circuit unit constitute a display unit.

Figure 1:
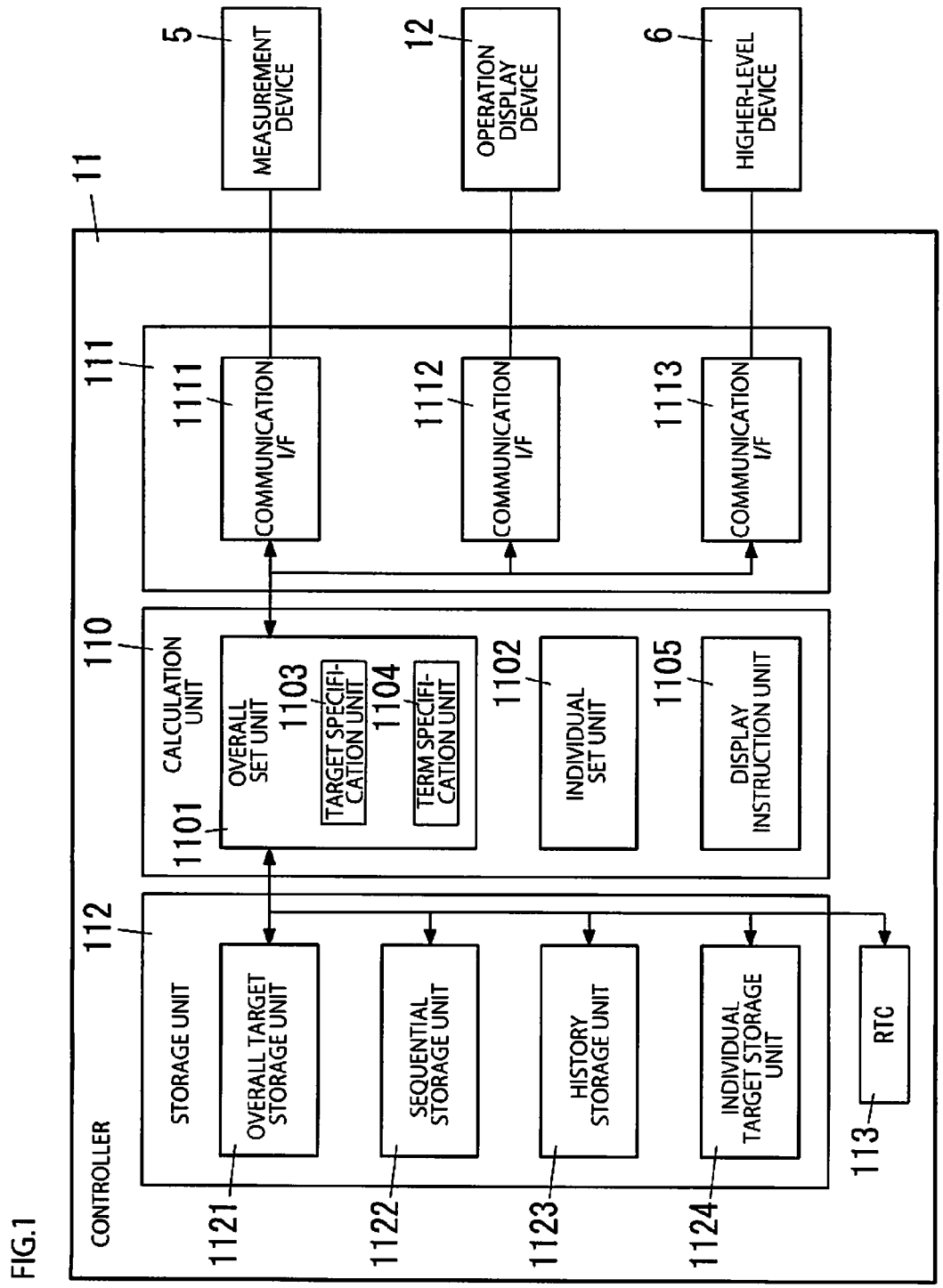
FIG. 1 is a block diagram illustrating an energy management apparatus according to a first embodiment.

As illustrated in FIG. 1, controller 11 includes communication unit 111 for communicating with another device. Communication unit 111 includes communication I/F 1111 as an acquisition unit, which acquires a measurement value from measurement device 5 through the communication with measurement device 5, communication I/F 1112 for communicating with operation display device 12, and communication I/F 1113 for communicating with higher-level device 6. Communication I/F 1113 communicates with higher-level device 6 via a communication network NT such as the Internet. Higher-level device 6 is a computer server, for example, and is administered by an electric power company in charge of generation and transmission of electric power or a service provider in charge of electric power management in place of the electric power company. Higher-level device 6 has a function of notifying controller 11 of a reduction target of the amount of electric power in accordance with a supply status of electric power from the electric power company and the like.

Controller 11 includes calculation unit 110 and storage unit 112 in order to manage a reduction target of the amount of electric power in the consumer. Calculation unit 110 is configured to include a device such as a microcomputer, which operates due to execution of a program as a main hardware element. Controller 11 further includes real-time clock (RTC) 113 which checks a current time and date.

Calculation unit 110 includes overall set unit 1101 which sets, with respect to the amount of electric power detected by electric power sensor C0, of the master circuit including electric conductor L3, a reduction target with respect to a reference value (hereinafter, referred to as an overall reference value) as an overall target value. Overall set unit 1101 includes target specification unit 1103 that sets a reduction target, and term specification unit 1104 that specifies a target term during which the electric power reduction is executed. Herein, the reduction target is given as a reduction rate with respect to the amount of electric power that is the overall reference value, and the overall target value is the amount of electric power obtained by subtracting the amount of electric power corresponding to the reduction rate from the amount of electric power that is the overall reference value. The reduction target and the overall target value represent the same thing, and thus are regarded to be equivalent hereinafter.

Term specification unit 1104 determines a target term as a combination of a term selected as a unit of day among one day, one week, one month, or one year, and a time zone during which a reduction target is intended to be attained. Overall target storage unit 1121 provided in storage unit 112 houses therein the determined target term. Term specification unit 1104 sets, for example, as an example illustrated in FIG. 4, target terms of three stages: a short term, a medium term, and a long term, in overall target storage unit 1121. In the illustrated example, the short term is set to one day, the medium term is set to one week, and the long term is set to two months. In other words, the short term is set as a target term at "13:00 to 16:00" on "3rd August", the medium term is set as a target term at "9:00 to 21:00" on "1st August to 7th August", and the long term is set as a target term at "9:00 to 21:00" on "1st July to 30th September".

Target specification unit 1103 in overall set unit 1101 sets a reduction target (in FIG. 4, reduction rate) for each target term. In the example illustrated in FIG. 4, a reduction target for the short term is set to 20%, a reduction target for the medium term is set to 15%, and a reduction target for the long term is set to 10%. The reduction target is a reduction rate with respect to an overall reference value determined as appropriate, and the overall reference value is obtained from a use history of the amounts of electric power of the consumer in principle. Further, the overall reference value can be given as a standard value based on the family composition of the consumer and the like.

The target terms and the reduction targets that overall set unit 1101 houses in overall target storage unit 1121 are given from higher-level device 6 through communication I/F 1113, or are given with an operation of operation display device 12 by a user through communication I/F 1112. Accordingly, the target terms and the reduction targets can be determined by an intention of the user or a request from the electric power company and the like.

Meanwhile, storage unit 112 includes sequential storage unit 1122 which accumulates the amount of electric power of every sampling period of time acquired from measurement device 5 and houses therein the accumulated value, and history storage unit 1123 to which the accumulated value of the amounts of electric power is transferred from sequential storage unit 1122 for every unit period of time (for example, one hour). History storage unit 1123 stores therein transition of the amount of electric power of every unit period of time.

Sequential storage unit 1122 respectively accumulates, as illustrated in FIG. 5, the amount of electric power of the master circuit (simply illustrated as master in FIG. 5) and the amounts of electric power of the branch circuits (illustrated as multiple branches D1 to Dn in FIG. 5) acquired from measurement device 5 for every sampling period of time, and stores therein the accumulated values. In the illustrated example, timestamps are not assigned because the amounts of electric power of every sampling period of time are accumulated. However, sequential storage unit 1122 may store therein not the accumulated values of the amounts of electric power of every sampling period of time but the amounts of electric power acquired for every sampling period of time with a timestamp.

Calculation unit 110 transfers the amounts of electric power housed in sequential storage unit 1122 to history storage unit 1123 for every time on the hour that real-time clock 113 checks. At this time, calculation unit 110 also houses a timestamp before one hour of the time on the hour in history storage unit 1123. Moreover, when sequential storage unit 1122 transfers the amounts of electric power to history storage unit 1123, calculation unit 110 resets the amounts of electric power stored in sequential storage unit 1122 to 0.

Accordingly, history storage unit 1123 stores therein, as illustrated in FIG. 6, the amount of electric power of the master circuit (simply illustrated as master in FIG. 6) and the amounts of electric power of the branch circuits (illustrated as multiple branches D1 to Dn in FIG. 6) for every one hour in association with timestamps. In other words, history storage unit 1123 stores therein 24 groups of the amounts of electric power, per one day. Further, these time relations are merely examples. The time interval that the amount of electric power is acquired from measurement device 5 may not be the sampling period of time, and the time interval that sequential storage unit 1122 transfers the stored values to history storage unit 1123 may not be one hour but may be 15 minutes or 30 minutes or some other time interval.

History storage unit 1123 has a storage capacity capable of storing therein the amount of electric power during one year or more. Overall set unit 1101 determines a long-term reduction target when a reduction target is set in overall target storage unit 1121 in response to a request from higher-level device 6. In this case, higher-level device 6 gives a term and a time zone, and a reduction rate. Accordingly, overall set unit 1101 sets the term and the time zone, and the reduction rate given by higher-level device 6 in overall target storage unit 1121 as a long-term reduction target.

An overall reference value relative to such a long-term reduction target can be obtained from a history (achievement) of measurement values with respect to the amount of electric power of the master circuit in the same period a year ago. Here, in the long-term reduction target, the term ranges several days and the time zone also ranges several hours. Therefore, among the measurement values of the achievement of the amounts of electric power stored in history storage unit 1123, a representative value such as a peak value of the measurement value in the concerned term is used as the overall reference value. The representative value used as the overall reference value may be a mean value or the like, other than the peak value.

The embodiment aims to set reduction targets (individual target value) for respective branch circuits or respective load devices 4. Accordingly, among the history of measurement values with respect to the amounts of electric power of the respective branch circuits or the respective load devices 4, a reference value (hereinafter, referred to as an individual reference value) is determined for each branch circuit or each load device 4 from a peak value or a mean value of the measurement values measured in the concerned term, and an individual target value needs to be set with respect to the individual reference value. Therefore, calculation unit 110 includes individual set unit 1102 which extracts a required electric power value from history storage unit 1123, obtains an individual reference value, and sets an individual target value of each branch circuit. Hereinafter, if no particular distinction is required, the individual target value is simply described as "target value".

Meanwhile, the representative value of the amount of electric power of each branch circuit obtained by individual set unit 1102 is not a value thereof generated at the same time on the same date. Accordingly, the amount of electric power obtained from the total of the representative values for the respective branch circuits or for the respective load devices 4 is normally inconsistent with the representative value of the amount of electric power of the master circuit (overall reference value of the master circuit) in the concerned term. Therefore, in order to determine an individual reference value for each branch circuit or for each load circuit 4 from the actual amount of electric power housed in history storage unit 1123, the actual amount of electric power needs to be corrected.

Figures 7, 8:
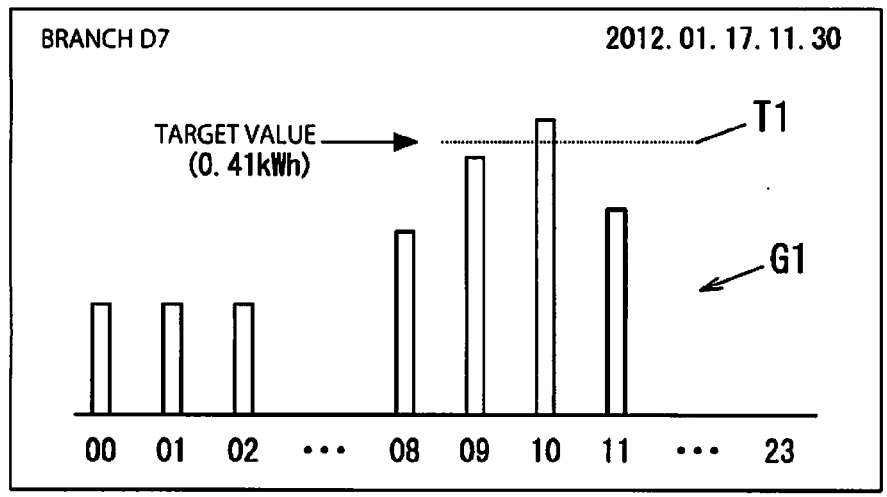
FIG. 7 is a view illustrating a data example of an individual target storage unit used in the energy management apparatus according to the first embodiment.
FIG. 8 is a view illustrating a display example in the energy management apparatus according to the first embodiment.

An explanation is made more specifically. Upon extracting the required amount of electric power, individual set unit 1102 sets the extracted amount of electric power in individual target storage unit 1124 provided in storage unit 112. Individual target storage unit 1124 includes, as illustrated in FIG. 7, a region in which the amount of electric power extracted from history storage unit 1123 is housed as an "individual reference value before correction" for each branch circuit or each load device 4. Further, individual target storage unit 1124 illustrated in FIG. 7 indicates an example in which a part of branch circuits (branches D1 to D6) among multiple branch circuits (branches D1 to Dn) are in one-to-one association with load devices 4 (illustrated as load devices 41 to 46 in FIG. 7).

Individual set unit 1102 uses the ratio of the overall reference value of the master circuit obtained from history storage unit 1123 to the total sum of the "individual reference values before correction" in order to correct each "individual reference value before correction" for each branch circuit stored in individual target storage unit 1124 to calculate each individual reference value for each branch circuit. In other words, individual set unit 1102 uses a value obtained by multiplying the "individual reference value before correction" for each branch circuit by the ratio as an individual reference value for each branch circuit. In other words, the individual reference value is obtained using the following equation. Calculation by the following equation is executed with a time interval that sequential storage unit 1122 transfers the stored values to history storage unit 1123.

Individual reference value=(individual reference value before correction)×(overall reference value of master circuit)/(total sum of individual reference values before correction)

An individual reference value after correction obtained by individual set unit 1102 using the above equation is housed in individual target storage unit 1124. A target value of each branch circuit is calculated by multiplying the individual reference value by a coefficient obtained from the reduction rate housed in overall target storage unit 1121. The calculated target value is stored in individual target storage unit 1124.

For example, when in individual target storage unit 1124 illustrated in FIG. 7, the total sum of "individual reference values before correction" is 10 kWh, and the overall reference value of the master circuit is 9 kWh, a value obtained by multiplying the "individual reference value before correction" by 0.9 is stored in an item of an individual reference value in individual target storage unit 1124. Moreover, because the reduction rate for the long term housed in overall target storage unit 1121 illustrated in FIG. 4 is 10%, a value that is 90% with respect to the individual reference value is stored in an item of a target value in individual target storage unit 1124.

In this manner, individual set unit 1102 in the embodiment distributes the overall target value set in overall set unit 1101 to the amounts of electric power of the respective branch circuits or the respective load devices 4. In other words, a target value of each branch circuit or each load device 4 is set by multiplying each individual reference value by the reduction rate.

Calculation unit 110 includes display instruction unit 1105 which causes operation display device 12 to display the target value of each branch circuit housed in individual target storage unit 1124, and the amount of electric power on that day acquired by measurement device 5 and stored in history storage unit 1123. The amount of electric power on that day stored in history storage unit 1123 contains the latest measurement value measured by measurement device 5. Therefore, the measurement value together with each target value of each branch circuit is displayed on a screen of operation display device 12.

FIG. 8 illustrates a display example. In the illustrated example, bar graph G1 indicates transition of the amount of electric power for every one hour with respect to one branch circuit (branch D7), and horizontal line T1 indicates a target value (0.41 kWh) set for the branch circuit. In FIG. 8, the horizontal axis represents the time when one day is expressed by 24 hours. In the illustrated example, the amount of electric power exceeds the target value during the period from 10 to 11 o'clock. Accordingly, the amount of electric power during the period from 11 to 12 o'clock might exceed the target value. Therefore, display instruction unit 1105 highlights and displays a bar indicating the amount of electric power during this period (a thick line indicates the highlight display in the drawing). This display calls a user's attention to reduce the amount of electric power to be used.

Further, although the example described above indicates the case where the reduction rate for the long term is constant (10%), if target terms are overlapped, the maximum reduction rate in the concerned term may be employed.

Second Embodiment

Figure 9:
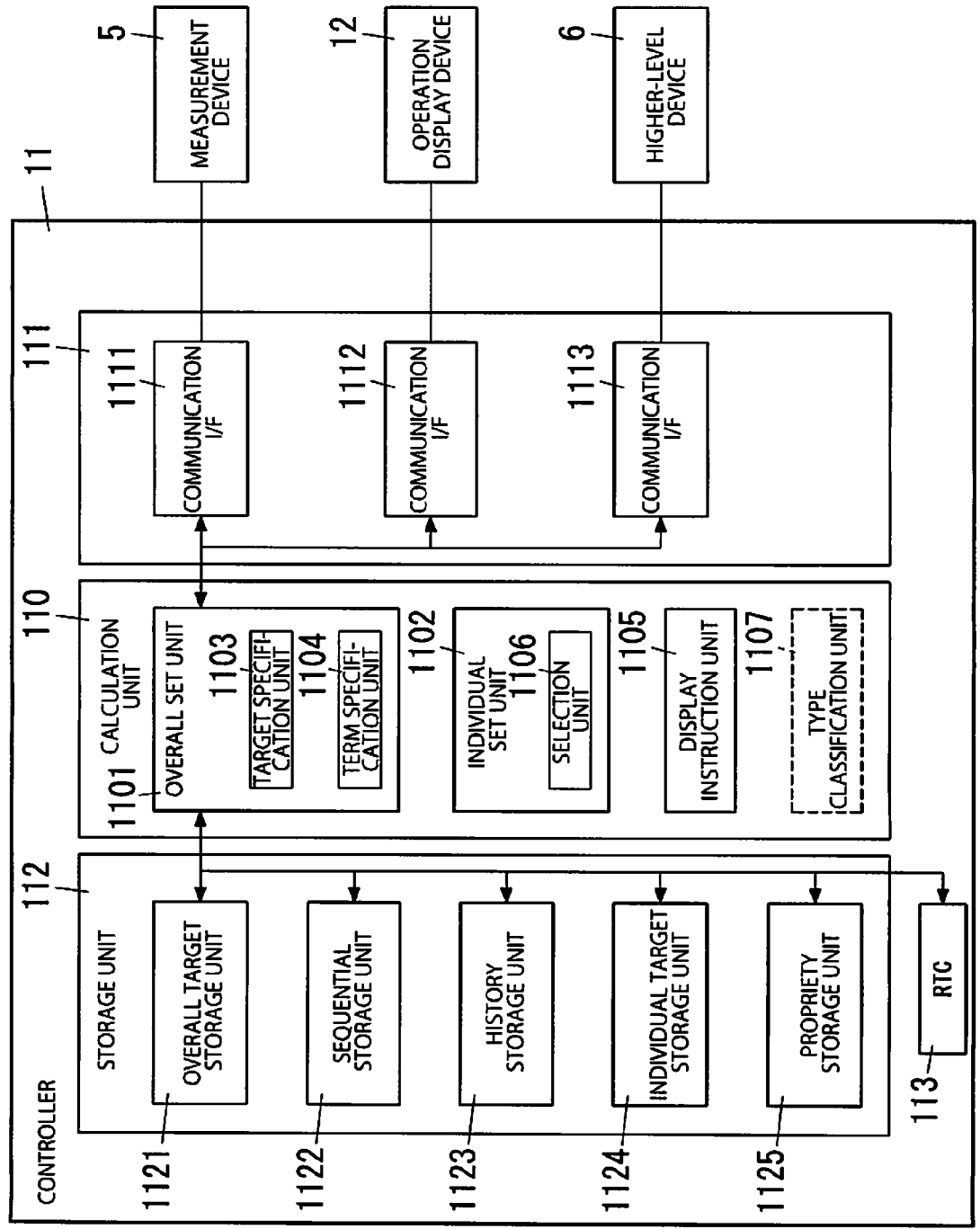
FIG. 9 is a block diagram illustrating an energy management apparatus according to a second embodiment.

In the embodiment, as illustrated in FIG. 9, propriety storage unit 1125 is provided in storage unit 112 of controller 11. Propriety storage unit 1125 houses therein propriety information indicating whether or not reduction of the amount of electric power of each branch circuit is implemented. The configuration of controller 11 illustrated in FIG. 9 is different from that of controller 11 illustrated in FIG. 1 in the first embodiment in the presence or absence of propriety storage unit 1125. For example, when load device 4 connected to a branch circuit is a microwave oven or a rice cooker, the amount of electric power of load device 4 connected to the branch circuit is difficult to be reduced. Therefore, the propriety information specifies that the reduction of the amount of electric power is not or cannot be implemented on the concerned branch circuit. Whether or not the amount of electric power is reduced is specified for each branch circuit with the propriety information in this manner. This allows a reduction state of the amount of electric power corresponding to the overall target value set for the master circuit to be monitored with respect to only a branch circuit in which the amount of electric power can be reduced.

Moreover, individual set unit 1102 in the embodiment includes selection unit 1106 which causes a user to set propriety information written into propriety storage unit 1125 using operation display device 12. Selection unit 1106 instructs display instruction unit 1105 to perform a display as illustrated in FIG. 10 on the screen of operation display device 12.

The screen illustrated in FIG. 10 displays selection buttons B1 to B8 for selecting the propriety of the electric power reduction for the respective branch circuits. In display regions of selection buttons B1 to B8, either a character string "able" or a character string "unable" is displayed. The user can switch the character string from "able" to "unable", or from "unable" to "able" every time pressing each of selection buttons B1 to B8 while this screen is being displayed.

Selection unit 1106 associates the character strings displayed in the display regions of selection buttons B1 to B8 with propriety information, and writes the propriety information corresponding to the character string selected on the screen of operation display device 12 into propriety storage unit 1125. In other words, the propriety information for each branch circuit selected by the user is set in propriety storage unit 1125. FIG. 11 illustrates propriety information written into propriety storage unit 1125 in association with the screen illustrated in FIG. 10.

Further, a case where operation display device 12 is a touch panel is assumed in the illustrated example. Although a term "press" is used because an operation to selection buttons B1 to B8 is similar to an operation to push button switches, the term "press" means that the tip of a finger or a pen or the like touches or is brought near to the extent almost to be touched to the display region of each selection button B1 to B8 in some implementations.

In the first embodiment, a target value of each branch circuit is set by evenly distributing the overall target value set for the master circuit to all the branch circuits. In contrast, in the embodiment, because the amount of electric power is not reduced in apart of the branch circuits, the overall target value cannot be evenly distributed. Therefore, a target value of each branch circuit is set by the following procedure.

Herein, it is assumed that each individual reference value for each branch circuit is obtained as similar to the first embodiment. In the example illustrated in FIG. 10 and FIG. 11, for example, target values as illustrated in FIG. 12 are set. In other words, in the example illustrated in FIG. 10 and FIG. 11, two branch circuits (branch D5 and branch D8) are specified that the amount of electric power is not reduced. Accordingly, the target values are consistent with the individual reference values in these branch circuits. Moreover, the reduction rate of the target value with respect to the individual reference value is larger than the reduction rate set for the master circuit in the other branch circuits.

As similar to the first embodiment, when the overall reference value of the master circuit is set to 9 kWh, and the reduction rate that is a reduction target is 10%, the overall target value of the master circuit becomes 8.1 kWh. With regard to the branch circuits, the total sum of the "individual reference values before correction" is 10 kWh, and among the total sum, the total of "individual reference values before correction" of the branch circuits in which the reduction is impossible is 2 kWh. Accordingly, the remaining 8 kWh is the amount of electric power to be reduced for attaining the target value of the master circuit. Accordingly, a relation in the following equation is established. Hereinafter, the branch circuit selected as a reduction target of the amount of electric power is referred to as a branch circuit as an "allocation object".

(Overall target value of master circuit)=(total sum of individual reference values before correction relative to branch circuits as allocation objects)×α+(total sum of individual reference values before correction relative to branch circuits other than allocation objects)

Accordingly, a coefficient α can be obtained from the following equation.

α={(overall target value of master circuit)−(total sum of individual reference values before correction relative to branch circuits other than allocation objects)}/(total sum of individual reference values before correction relative to branch circuits as allocation objects)

A target value of each branch circuit as an allocation object is calculated by obtaining the coefficient α from the above equation, and multiplying the coefficient α with an individual reference value before correction of each branch circuit as an allocation object. In the example illustrated in FIG. 12, the overall target value of the master circuit is 8.1 kWh, the total sum of the individual reference values before correction relative to the branch circuits as allocation objects is 8 kWh, and the total sum of the individual reference values before correction relative to the branch circuits other than the allocation objects is 2 kWh. Accordingly, the coefficient α becomes α=(8.1−2)/8=0.7625. Each target value of each branch circuit as an allocation object can be obtained by multiplying the coefficient α with each individual reference value before correction of each branch circuit as an allocation object. In other words, in the example illustrated in FIG. 12, each target value of each branch circuit as an allocation object can be obtained by multiplying each individual reference value before correction of each branch circuit as an allocation object by 0.7625. Further, in FIG. 12, the third decimal place is rounded. The total of the target values of the respective branch circuits in FIG. 12 becomes 8.09, which satisfies the overall target value of the master circuit.

As in the foregoing, in the embodiment, a user him/herself selects a branch circuit in which the reduction of the amount of electric power is impossible, and a target value of each branch circuit excluding the selected branch circuit necessary for attaining the overall target value is set. Therefore, it is possible to obtain a guide of a target value for attaining the overall target value while an operation of load device 4 in which the reduction of the amount of electric power is impossible is maintained. Information displayed in operation display device 12 is similar to that of the first embodiment.

Although a user selects the propriety of the reduction of the amount of electric power of each branch circuit in the example described above, the user may select a branch circuit in which the amount of electric power is reduced. In other words, the user may positively select a branch circuit that the user intends to perform the reduction of the amount of electric power but does not passively select a branch circuit in which the reduction of the amount of electric power is impossible. For example, if load devices 4 are an air-conditioner, an illumination device, an IH cooking device, and the like with the comparatively large consumption electric power which allows the amount of electric power to be reduced, the user may positively select the branch circuits connected with such load devices 4 for the reduction of the amount of electric power. The processing after the selection is similar to the operation described above.

Meanwhile, when the branch circuits connected with load devices 4 that the amount of electric power is intended to be reduced as in the foregoing are positively selected, a target value may be set for each type of load devices 4 in a collective manner. Herein, as illustrated in FIG. 13, assuming a case where among eight branch circuits, three circuits are connected with air-conditioners, two circuits are connected with illumination devices, one circuit is connected with an IH cooking device, and the remaining two circuits are connected with other devices (such as plug sockets). In the example illustrated in FIG. 13, the branch circuits respectively corresponding to the air-conditioners, the illumination devices, and the IH cooking device are selected as objects in which the amount of electric power is reduced. Moreover, a target value that is the total of the amounts of electric power of each type of load devices 4 is set. In this case, as illustrated in FIG. 14, bar graph G2 indicating not transition of the measurement value of the amount of electric power of an individual branch circuit but transition of the summed-up amounts of electric power of branch circuits connected with load devices 4 of the same, is displayed together with horizontal line T2 indicating a target value (4 kWh).

As the example illustrated in FIG. 14, the amounts of electric power of all load devices 4 of the same type in a consumer are summed up are managed to allow target management for each type of load devices 4. Moreover, screens of operation display device 12 are configured on a per type of load device 4 basis to reduce the number of screens compared with a case where screens of operation display device 12 are configured on a per branch circuit basis. This also reduces a burden of selecting a screen for the user. Further, although a target value is managed for each type of load devices 4 in a collective manner in the example described above, it is possible to employ a configuration in which a target value of each room in the consumer is managed.

In the operation described above, the bar graph indicating transition of the amount of electric power of each branch circuit is displayed on the screen of operation display device 12. In contrast, as illustrated in FIGS. 15A to 15C, a screen on which target values and individual reference values of the respective branch circuits are displayed side by side may be provided to allow values of all the branch circuits to be seen at a glance.

Figure 15A:
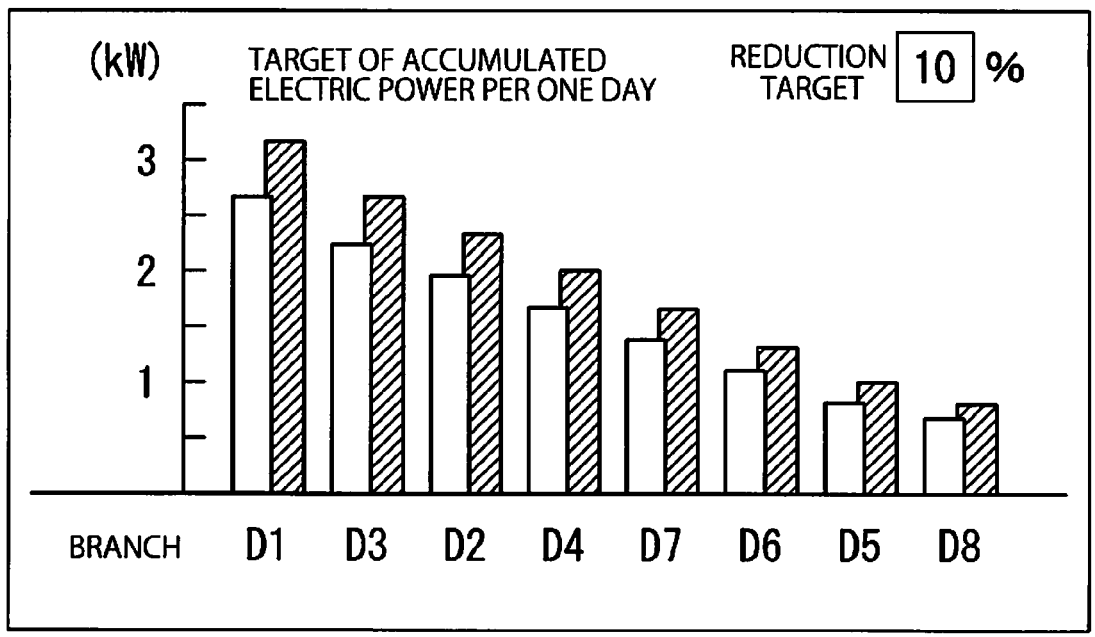
FIG. 15A is a view illustrating a display example of a screen on which a target value is set in the energy management apparatus according to the second embodiment.

FIG. 15A illustrates a display example of a case where the overall target value of the master circuit is evenly distributed to all the branch circuits as in the first embodiment. In the drawing, a solid-white bar indicates a target value and a diagonally shaded bar indicates an individual reference value (actual value a year ago). Further, the target value and the individual reference value may be differently displayed in color. Moreover, on the screen of operation display device 12, individual reference values for the respective branch circuits are arranged in descending order. This allows the user to intuitively understand a branch circuit necessary for increase in the reduction amount of the amount of electric power in order to attain the overall target value.

Figure 15B:
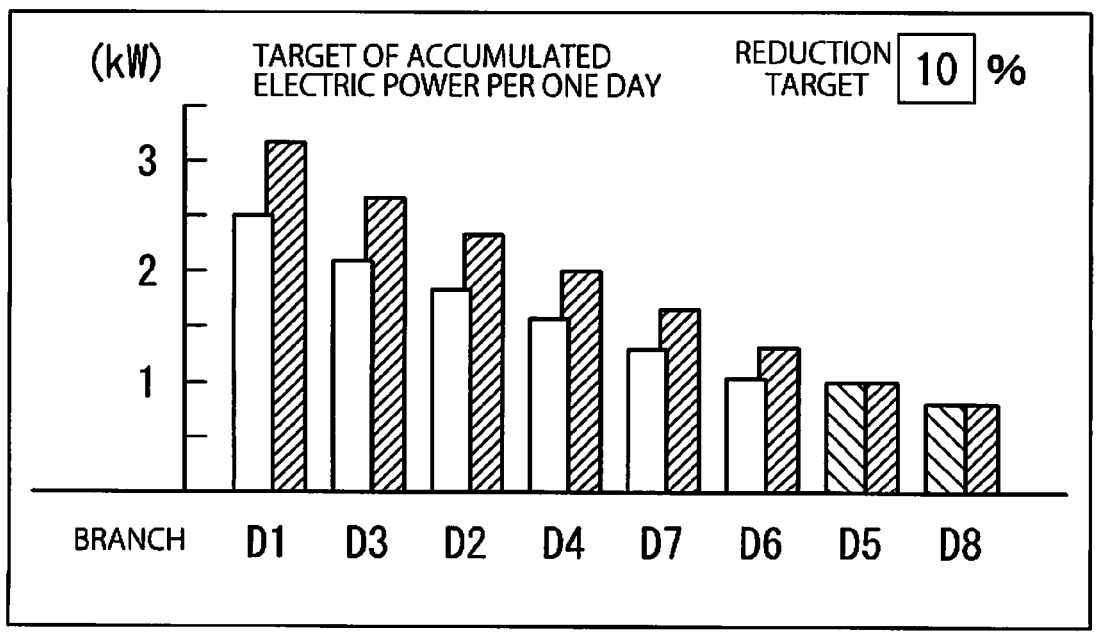
FIG. 15B is a view illustrating a display example of a screen on which a target value is set in the energy management apparatus according to the second embodiment.
Figure 15C:
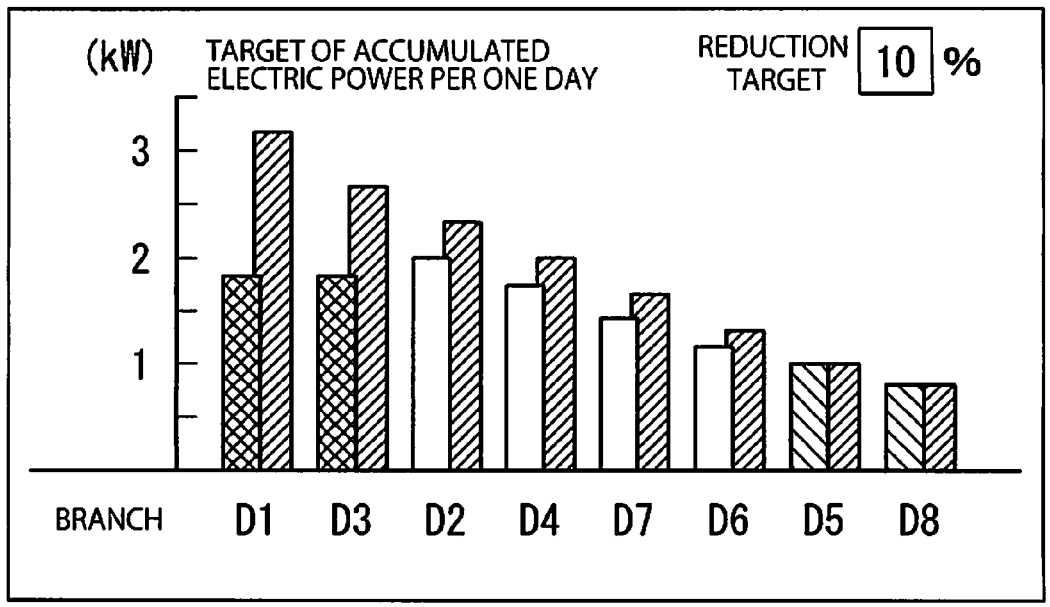
FIG. 15C is a view illustrating a display example of a screen on which a target value is set in the energy management apparatus according to the second embodiment.

FIG. 15B illustrates a display example of a case where a branch circuit is selected as an out-of allocation object as in the second embodiment. In other words, from the state displayed as in FIG. 15A, performing an operation of pulling up a bar indicating a target value to the level of an individual reference value makes it possible to set the corresponding branch circuit as an out-of allocation object. For example, performing an operation of touching the bar with the tip of a finger, and sliding the tip of the finger being touched upward to raise the bar to the level of the individual reference value. Moreover, the branch circuit which is excluded from the allocation object is displayed as a diagonally shaded bar instead of the solid-white bar indicating the target value. Also in this case, the bar indicating the branch circuit being excluded from the allocation object may be differently displayed in color from the bar indicating the individual reference value. As in the foregoing, when the branch circuit is excluded from the allocation object, target values of the other branch circuits are calculated again to change the lengths of the bars indicating the target values. Individual set unit 1102 performs this processing.

As is the example illustrated in FIG. 15B, when parts of the branch circuits are excluded from the allocation objects, target values of the remaining all branch circuits are equally lowered. However, difficulty in change of the target value differs from each branch circuit. Therefore, not only change of raising the target value to the individual reference value but also change of lowering the target value is also possible. FIG. 15C illustrates an example of a case where target values are changed to be lowered, and target values of the branch circuits of branch D1 and branch D3 are lowered.

In the illustrated example, cross-hatched bars instead of the solid-white bars are displayed for illustrating that the target values are changed. Also in this case, it may display the changed target value differently in color from the other bars. Moreover, with the change of the target values of the branch circuits of branch D1 and branch D3, target values of the remaining branch circuits (branch D2, branch D4, branch D7, and branch D6) are calculated again to raise the target values. However, the target values of these branch circuits not changed directly by the user are displayed still using the solid-white bars. Individual set unit 1102 also performs this processing.

As is the example illustrated in FIG. 15C, when the target values of multiple branch circuits with larger amounts of electric power as measurement values are lowered, the overall target value of the master circuit is easy to be attained. In other words, lowering the target value of a branch circuit through which the smaller amount of electric power is passed results in the less reflection on the reduction rate of the amount of electric power of the master circuit. In contrast, lowering the target value of a branch circuit through which the larger amount of electric power is passed results in the higher contribution to the reduction rate of the amount of electric power of the master circuit. Accordingly, individual set unit 1102 may select one or multiple branch circuits in decreasing order of the measured amount of electric power as branch circuits of allocation objects. In this case, only one or multiple branch circuits in which the level of the amount of electric power is higher in the consumer become allocation objects. This realizes an easy operation of setting target values.

Other configurations and operations are similar to those in the first embodiment, and therefore an explanation thereof is omitted.

Third Embodiment

A user selects a branch circuit of an allocation object in which the amount of electric power is reduced in the second embodiment. In the embodiment, described is a configuration example in which change of the amounts of electric power used in load devices 4 is monitored, and the types of load devices 4 are classified using the change patterns to automatically extract a branch circuit to which load device 4 as an allocation object is connected.

Specifically, calculation unit 110 of controller 11 includes type classification unit 1107 (see FIG. 9) which classifies the type of load device 4 connected to a branch circuit from the change pattern of the amount of electric power. Display instruction unit 1105 which displays a bar graph indicating transition of the amount of electric power on that day and the target value on the screen of operation display unit 12 further displays advice for reducing the amount of electric power in accordance with the type of load device 4. Type classification unit 1107 measures the amount of electric power of each branch circuit for every predetermined period of time (time interval during when sequential storage unit 1122 transfers the stored value to history storage unit 1123) to classify load devices 4 into three types on the basis of the relation of the change of the amount of electric power and a threshold value set as appropriate.

Figure 16A:
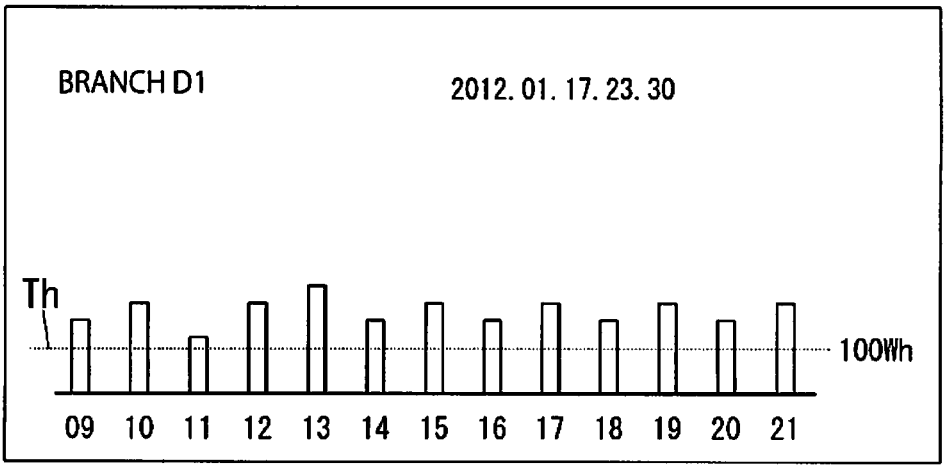
FIG. 16A is a view for explaining a principle of an energy management apparatus according to a third embodiment.
Figure 16B:
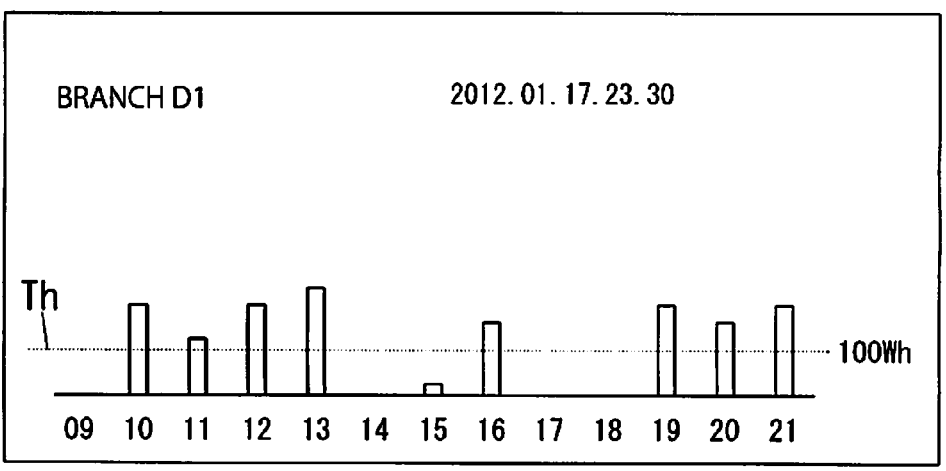
FIG. 16B is a view for explaining the principle of the energy management apparatus according to the third embodiment.
Figure 16C:
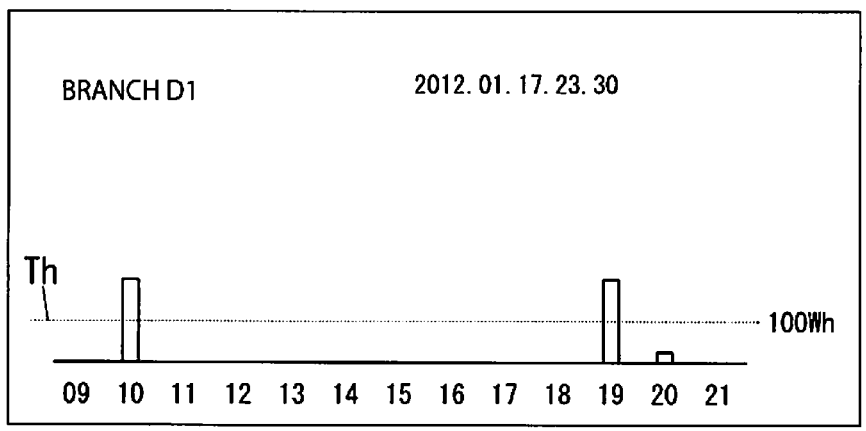
FIG. 16C is a view for explaining the principle of the energy management apparatus according to the third embodiment.

Type classification unit 1107 sets, for example, as illustrated in FIGS. 16A to 16C, threshold value Th as appropriate (100 Wh in an illustrated example). As for load device 4, such as a refrigerator, in which the electric power is consumed all the time, the amount of electric power for every predetermined period of time is never lower than threshold value Th as in FIG. 16A. Moreover, as for load device 4 such as an air-conditioner and an illumination device, in which a power supply is turned on several times a day, the amount of electric power for every predetermined period of time exceeds threshold value Th with relatively high frequency as in FIG. 16B but time zones during which the amount of electric power does not exceed threshold value Th are generated. In addition, as for load device 4 in which a power supply is turned on in a short period of time or with low frequency, the amount of electric power exceeds threshold value Th with extremely low frequency as in FIG. 16C.

Accordingly, dividing the number of times that the amount of electric power for every predetermined period of time exceeds threshold value Th a day into multiple stages allows the types of load devices 4 connected to the branch circuits to be roughly classified. Hereinafter, load device 4 with a change pattern of the amount of electric power as in FIG. 16A is referred to type 1, load device 4 as in FIG. 16B is referred to type 2, and load device 4 as in FIG. 16C is referred to type 3. For example, comparing the amount of electric power for every one hour with threshold value Th makes it possible to classify load device 4 into type 1, type 2, or type 3 in accordance with the number of times that the amount of electric power exceeds threshold value Th. For example, it is possible to classify 20 times or more of the number of times that the amount of electric power exceeds threshold value Th into type 1, 4 times or more and 19 times or less into type 2, and 3 times or less into type 3.

In this case, a branch circuit to which load device 4 of type 1 is connected is determined that the amount of electric power is unable to be reduced. The branch circuit to which load device 4 of type 1 is connected is excluded from the allocation object as a branch circuit in which no reduction of the amount of electric power is performed. Further, the amount of electric power is able be reduced in some cases even for load device 4 of type 1, such as a refrigerator, by setting the indoor temperature. When load circuit 4 is a refrigerator, advice indicating that the reduction of the amount of electric power is possible by raising the indoor temperature may be displayed on the screen of operation display device 12.

Moreover, a branch circuit to which load device 4 of type 2 or type 3 is connected is determined that the amount of electric power can be reduced. Further, it may give advice to the user, in accordance with the number of times that the amount of electric power exceeds threshold value Th, whether the amount of electric power is reduced in a target term during when the electric power reduction is executed, or the amount of electric power is reduced in a target term by using load device 4 in a term other than the target term. Such advice is displayed on the screen of operation display device 12.

As for load device 4 of type 3 with low frequency of operation, advice to exclude a time zone that load device 4 of type 3 is in use from the target term is given. Moreover, as for load device 4 of type 2, advice to short a period of time in use, or to select an operation with the less amount of electric power to be consumed is given. For example, as for an air-conditioner that is load device 4 of type 2, advice to stop an operation after the air-conditioner is being operated in a certain period of time is given. Note that, the numerical values in the example described above are examples, and are set as appropriate in accordance with the actual use environment.

Figure 17A:
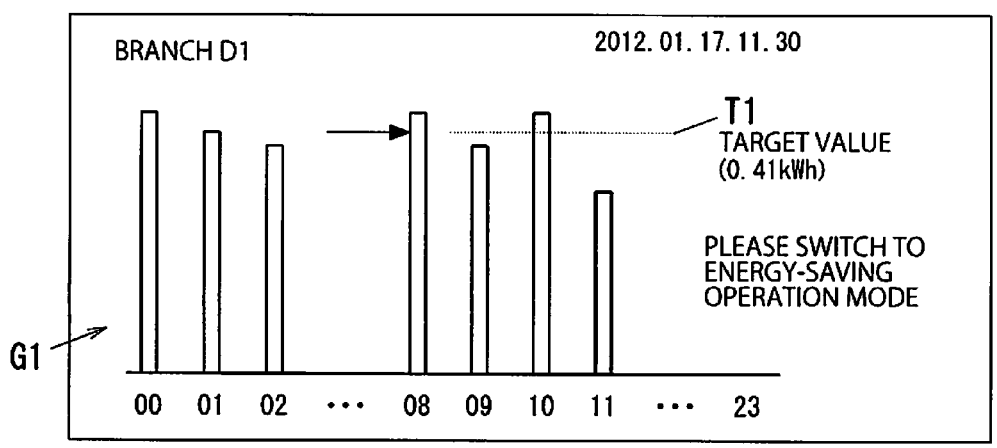
FIG. 17A is a view illustrating a display example on which advice is appeared of the energy management apparatus with according to the third embodiment.
Figure 17B:
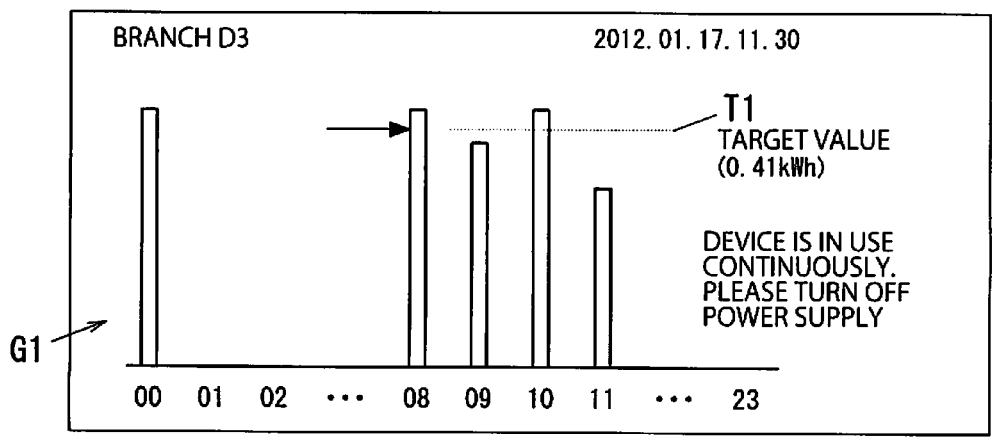
FIG. 17B is a view illustrating a display example on which advice is appeared of the energy management apparatus with according to the third embodiment.
Figure 17C:
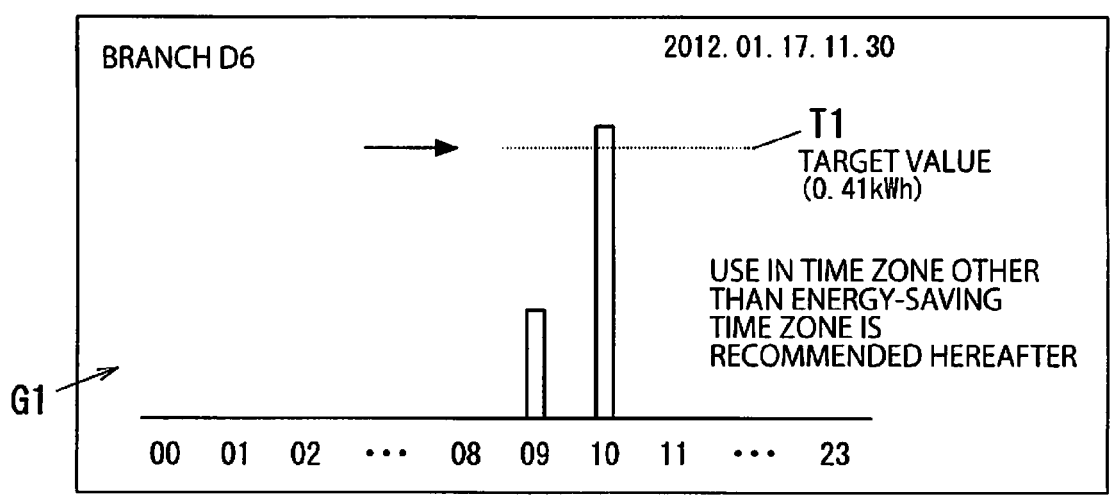
FIG. 17C is a view illustrating a display example on which advice is appeared of the energy management apparatus with according to the third embodiment.

FIGS. 17A to 17C each illustrates a display example of the screen of operation display device 12. In FIG. 17A corresponding to a branch circuit to which load device 4 of type 1 is connected, a bar graph indicating the amount of electric power of for every one hour and horizontal line T1 indicating a target value are illustrated, and advice that "PLEASE SWITCH TO ENERGY-SAVING OPERATION MODE" is indicated because the amount of electric power exceeds the target value. In FIG. 17B corresponding to a branch circuit to which load device 4 of type 2 is connected, advice that "DEVICE IS IN USE CONTINUOUSLY. PLEASE TURN OFF POWER SUPPLY" is indicated because the amount of electric power exceeds the target value. In addition, in FIG. 17C corresponding to a branch circuit to which load device 4 of type is connected, advice that "USE IN TIME ZONE OTHER THAN ENERGY-SAVING TIME ZONE IS RECOMMENDED HEREAFTER" because the amount of electric power exceeds the target value.

Other configurations and operations are similar to those in the first embodiment and the second embodiment, and therefore an explanation thereof is omitted.

Although embodiments of the invention are described, various variations and modifications can be made by a person skilled in the art without deviating the original split and the range of the invention, that is, the scope of the invention.

A program that realizes energy management as described above may be stored on a non-transitory computer readable medium. The program stored in the recording medium is read into a system, such as computer, so that the above-described energy management can be realized by executing the program while controlling the system. The medium includes such devices as a memory device, magnetic disk device, and an optical disk device, that are able to record the program. For example, the recording medium could be Blu-Ray disk CD-ROM (Compact Disc, read only memory), DVD (Digital Versatile Disc), ZIP disc, JAZ disc, MO (Magneto-optical) disc, DAT (Digital Audio Tape), or the like.

The invention claimed is:

1. An energy management apparatus, comprising:
    an acquisition unit configured to acquire first measurement values of the amounts of electric power of respective branch circuits or respective load devices and second measurement values of the amount of electric power of a master circuit provided for a building from a measurement device;
    an overall set unit configured to obtain an overall reference value by calculation on the basis of a history of the second measurement values, and to receive a reduction target to set an overall target value on the basis of the overall reference value and the reduction target;
    an individual set unit configured to set an individual target value by distributing the overall target value set in the overall set unit to the amounts of electric power of the respective branch circuits or the respective load devices as allocation objects; and
    a display instruction unit configured to instruct display of the individual target value and the first measurement values acquired by the acquisition unit.

2. The energy management apparatus according to claim 1, wherein the overall set unit includes a term specification unit configured to specify a target term during which the overall target value is set.

3. The energy management apparatus according to claim 1, wherein
    the individual set unit
        obtains an individual reference value by multiplying the amount of electric power of the branch circuit or the load device as the allocation object by a ratio of the amount of electric power of the master circuit to a total sum of the first measurement values, and
        sets the individual target value by evenly distributing the overall target value to the individual reference values.

4. The energy management apparatus according to claim 1, wherein
    the individual set unit
        obtains an individual reference value before correction on the basis of the history of the second measurement values,
        obtains an individual reference value by multiplying the individual reference value before correction for each of the branch circuits or each of the load devices by a ratio of the overall reference value to a total sum of the individual reference values before correction in the branch circuits or the load devices as the allocation objects, and
        sets the individual target value by evenly distributing the overall target value to the individual reference values.

5. The energy management apparatus according to claim 1, further comprising a propriety storage unit configured to store therein propriety information indicating whether or not reduction of the electric power of each of the branch circuits or each of the load devices can be implemented, wherein the individual set unit includes a selection unit configured to cause a user to set the propriety information stored in the propriety storage unit.

6. The energy management apparatus according to claim 1, wherein the individual set unit arranges the amounts of electric power of the branch circuits or the load devices in descending order, and selects one of or multiple of the branch circuits or the load devices in the higher order of the amounts of electric power of the branch circuits or the load devices as the allocation object.

7. The energy management apparatus according to claim 1, further comprising:
    a type classification unit configured to classify types of changes of electric power using change patterns of the amounts of electric power of the branch circuits or the load devices
    wherein the display instruction unit is configured to cause the display screen to display advice for reducing the amount of electric power of the branch circuit or the load device using the type classified by the type classification unit.

8. An energy management system, comprising:
    the measurement device attached to a distribution board installed at or adjacent to a building or a load device used by a consumer and configured to measure the amount of electric power; and
    the energy management apparatus according to claim 1.

9. A non-transitory computer-readable storage medium storing therein a program to cause a computer to function as an energy management apparatus when executing the program, including:
    an acquisition unit configured to acquire first measurement values of the amounts of electric power of respective branch circuits or respective load devices and second measurement values of the amount of electric power of a master circuit provided for a building from a measurement device;
    an overall set unit configured to obtain an overall reference value by calculation on the basis of a history of the second measurement values;
    an individual set unit configured to set an individual target value by distributing the overall target value set in the overall set unit to the amounts of electric power of the respective branch circuits or the respective load devices as allocation objects; and a display instruction unit configured to instruct display of the individual target value and the first measurement values acquired by the acquisition unit.

10. The storage medium according to claim 9, wherein the overall set unit includes a term specification unit configured to specify a target term during which the overall target value is set.

11. The storage medium according to claim 9, wherein the individual set unit obtains an individual reference value by multiplying the amount of electric power of the branch circuit or the load device as the allocation object by a ratio of the amount of electric power of the master circuit to a total sum of the first measurement values, and sets the individual target value by evenly distributing the overall target value to the individual reference values.

12. The storage medium according to claim 9, wherein the individual set unit obtains an individual reference value before correction on the basis of the history of the second measurement values, obtains an individual reference value by multiplying the individual reference value before correction for each of the branch circuits or each of the load devices by a ratio of the overall reference value to a total sum of the individual reference values before correction in the branch circuits or the load devices as the allocation objects, and sets the individual target value by evenly distributing the overall target value to the individual reference values.

13. The storage medium according to claim 9, the program further causing the computer to function as:

a propriety storage unit configured to store therein propriety information indicating whether or not reduction of the electric power of each of the branch circuits or each of the load devices can be implemented, wherein the individual set unit includes a selection unit configured to cause a user to set the propriety information stored in the propriety storage unit.

14. The storage medium according to claim 9, wherein the individual set unit arranges the amounts of electric power of the branch circuits or the load devices in descending order, and selects one of or multiple of the branch circuits or the load devices in the higher order of the amounts of electric power of the branch circuits or the load devices as the allocation object.

15. The storage medium according to claim 9, the program further causing the computer to function as:

a type classification unit configured to classify types of changes of electric power using change patterns of the amounts of electric power of the branch circuits or the load devices; and a display instruction unit configured to causes the display unit to display advice for reducing the amount of electric power of the branch circuit or the load device using the type classified by the type classification unit.

16. An energy management method, comprising:

acquiring, by a computer, first measurement values of the amounts of electric power of respective branch circuits or respective load devices and second measurement values of the amount of electric power of a master circuit provided for a building;

obtaining an overall reference value by calculation on the basis of a history of the first measurement values, and receiving a reduction target to set an overall target value on the basis of the overall reference value and the reduction target;

setting an individual target value by distributing the overall target value set in the overall set unit to the amounts of electric power of the respective branch circuits or the respective load devices as allocation objects; and instructing display of the individual target value and the first measurement values.

17. The energy management method according to claim 16, wherein the setting step specifies a target term during which the overall target value is set.

18. The energy management method according to claim 16, wherein the setting step comprises:

obtaining an individual reference value by multiplying the amount of electric power of the branch circuit or the load device as the allocation object by a ratio of the amount of electric power of the master circuit to a total sum of the first measurement values as the allocation objects, and setting the individual target value by evenly distributing the overall target value to the individual reference values.

19. The energy management method according to claim 16, wherein the setting step comprises:

obtaining an individual reference value before correction on the basis of the history of the second measurement values, obtaining an individual reference value by multiplying the individual reference value before correction for each of the branch circuits or each of the load devices by a ratio of the overall reference value to a total sum of the individual reference values before correction in the branch circuits or the load devices as the allocation objects, and setting the individual target value by evenly distributing the overall target value to the individual reference values.

20. The energy management method according to claim 16, wherein the setting step comprises:

arranging the amounts of electric power of the branch circuits or the load devices in descending order, and selecting one of or multiple of the branch circuits or the load devices in the higher order of the amounts of electric power of the branch circuits or the load devices as the allocation object.

* * * * *